United States Patent
Yoshida

(10) Patent No.: US 7,355,656 B2
(45) Date of Patent: Apr. 8, 2008

(54) VIDEO SIGNAL PROCESSING DEVICE AND TELEVISION RECEIVING DEVICE

(75) Inventor: Yoshifumi Yoshida, Ota (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 503 days.

(21) Appl. No.: 10/944,208

(22) Filed: Sep. 17, 2004

(65) Prior Publication Data

US 2005/0062890 A1    Mar. 24, 2005

(30) Foreign Application Priority Data

Sep. 19, 2003   (JP)  ............................. 2003-328683

(51) Int. Cl.
  *H04N 5/57*  (2006.01)
(52) U.S. Cl. ..................................... 348/678
(58) Field of Classification Search ................ 348/678, 348/679, 572, 573, 575
  See application file for complete search history.

(56) References Cited

U.S. PATENT DOCUMENTS

| | | | | |
|---|---|---|---|---|
| 4,434,439 A | * | 2/1984 | Steckler et al. ............. | 348/572 |
| 5,012,358 A | * | 4/1991 | Kohsaka ...................... | 360/70 |
| 5,278,659 A | * | 1/1994 | Araki ....................... | 348/230.1 |
| 5,485,205 A | * | 1/1996 | Miyata ........................ | 348/248 |
| 5,517,236 A | * | 5/1996 | Sergeant et al. ............ | 348/143 |
| 2006/0007211 A1 | * | 1/2006 | Murayama et al. ......... | 345/204 |

FOREIGN PATENT DOCUMENTS

| JP | 8-125122 | 5/1996 |
|---|---|---|
| JP | 2001-356831 | 12/2001 |

OTHER PUBLICATIONS

English Patent Abstract of 8-125122 from esp@cenet, published Oct. 7, 1997.
English Patent Abstract of 2001-356831 from esp@cenet, published Dec. 26, 2001.

* cited by examiner

*Primary Examiner*—Paulos M. Natnael
(74) *Attorney, Agent, or Firm*—Osha Liang LLP

(57) ABSTRACT

A video signal processing device is provided comprising an input level detecting circuit for detecting an amplitude of a video signal to be processed and an analog/digital converter for performing analog/digital conversion of the video signal using as a reference voltage a voltage in accordance with the amplitude of the video signal detected by the input level detecting circuit.

5 Claims, 6 Drawing Sheets

VIDEO SIGNAL PROCESSING DEVICE AND TELEVISION RECEIVING DEVICE

CROSS-REFERENCE TO RELATED APPLICATIONS

The priority Japanese application No. 2003-328683 upon which this patent application is based is hereby incorporated by reference.

BACKGROUND OF THE INVENTION

1. Field of the Invention

The present invention relates to a video signal processing device for converting an analog video signal into a digital signal having an appropriate dynamic range, and a television receiving device including such a video signal processing device.

2. Description of the Related Art

Video signals for color television are commonly broadcast as composite signals including luminance (Y) and color difference (C) information. For digitizing such a video signal, a video signal processing device for appropriately controlling the dynamic range of an analog/digital converter is used. Such a technique is disclosed in, for example, Japanese Patent Laid-Open Publication Nos. Hei 8-125122 and 2001-356831.

Referring to FIG. 5, a typical conventional video signal processing device 100 includes a channel switching circuit 10, an input level detecting circuit 12, a programmable amplifier 14, and a digital/analog converter (A/D converter) 16. The channel switching circuit 10 includes a multiplexer operating based on a channel selection signal provided from an external source so as to select and provide one of a plurality of input video signals. The input level detecting circuit 12 receives the video signal selected by the channel switching circuit 10, detects an amplitude of the video signal, and outputs a gain control signal for adjusting an amplification ratio of the programmable amplifier 14 based on the detected amplitude. The programmable amplifier 14 receives the gain control signal from the input level detecting circuit 12, and amplifies and outputs the video signal selected by the channel switching circuit 10 at the amplification ratio in accordance with the gain control signal. The A/D converter 16 receives the output from the programmable amplifier 14, converts the analog signal into the digital signal, and outputs the converted signal.

By way of example, when the gain control signal provided from the input level detecting circuit 12 is 3 dB, the video signal is amplified twice in the programmable amplifier 14 before input to the A/D converter 16, as illustrated in FIG. 6. The A/D converter 16 outputs a digitized video signal digitized with a dynamic range in accordance with the difference between a voltage Vt applied to a maximum reference voltage terminal VRT and a voltage Vb applied to a minimum reference voltage terminal VRB. For example, when the voltages Vt and Vb are 2 V and 0 V, respectively, the potential difference is 2 V. The amplitude of the video signal is then amplified to the level of approximately 2V by the programmable amplifier 14, thereby fully utilizing the dynamic range of the A/D converter 16 to digitize the signal.

Thus, a wide dynamic range of the digitized video signal is secured by adjusting the amplitude of the video signal in line with the dynamic range of the A/D converter 16 using the programmable amplifier 14 in conventional video signal processing devices. However, a circuit for forming the programmable amplifier 14 is complicated, resulting in an increase in the size of the chip area required for the video signal processing device. In addition, reliable realization of favorable properties remains a difficult and complicated process.

SUMMARY OF THE INVENTION

The present invention provides a video signal processing device comprising an input level detecting circuit for detecting an amplitude of a direct current component of a video signal to be processed, and an analog/digital converter for performing analog/digital conversion of the video signal using as a reference voltage a voltage in accordance with the amplitude of the direct current component of the video signal detected by the input level detecting circuit.

Further, a television receiving device can be formed comprising video signal receiving circuit for receiving a video signal; an input level detecting circuit for detecting an amplitude of a direct current component of the video signal received by the video signal receiving circuit, and providing a control signal in accordance with the amplitude; a PWM circuit for receiving the control signal from the input level detecting circuit, modulating a pulse width in accordance with the amplitude of the direct current component of the video signal received by the video signal receiving circuit, and providing a PWM signal; and an analog/digital converter for performing analog/digital conversion of the video signal received by the video signal receiving circuit using as a reference voltage a voltage obtained by smoothing the PWM signal in terms of time, wherein a video image is displayed based on the video signal digitized by the analog/digital converter.

DESCRIPTION OF PREFERRED EMBODIMENT

Figure 1:
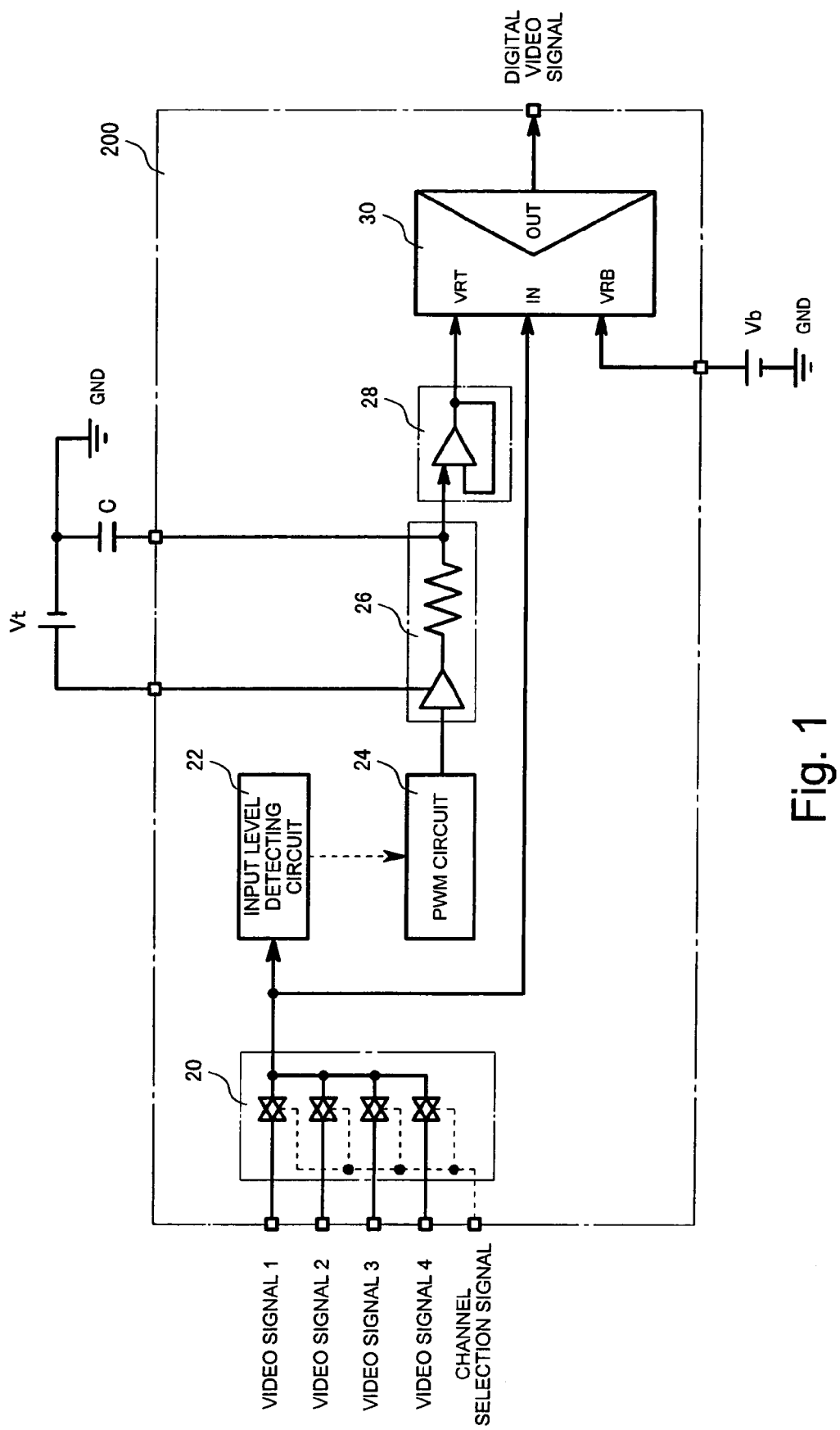
FIG. 1 is a block diagram showing a configuration of a video signal processing device according to a first embodiment of the present invention.

Referring to FIG. 1, a video signal processing device 200 according to a preferred embodiment of the present invention includes a channel switching circuit 20, an input level detecting circuit 22, a pulse width modulation circuit (PWM circuit) 24, an interface circuit 26, a control amplifier 28, and an analog/digital converter (A/D converter) 30. The video signal processing device 200 is externally connected to a capacitor C for a low pass filter through the interface circuit 26.

The channel switching circuit 20 includes a multiplexer. Receiving a plurality of incoming video signals, the channel switching circuit 20 selects and outputs one of the signals. The selected video signal is output to the input level detecting circuit 22 and the A/D converter 30.

In the configuration of FIG. 1, four video signals are provided to the channel switching circuit 20. The channel switching circuit 20 receives from outside of the device a channel selection signal provided by, for example, a user with a remote control, and causes the multiplexer to operate based on the channel selection signal, thereby selecting one of the provided four video signals.

It should be noted that the channel switching circuit 20 is not always necessary. For example, when only one video signal is provided to the video signal processing circuit 200, the channel switching circuit 20 is not necessary. Even when more video signals are provided, it may be any circuit as long as it can select one of the signals.

The input level detecting circuit 22 includes a general comparator circuit and a digital/analog converter. The input level detecting circuit 22 receives the video signal from the channel switching circuit 20, and outputs a PWM control signal based on the amplitude of the video signal.

Figure 2:
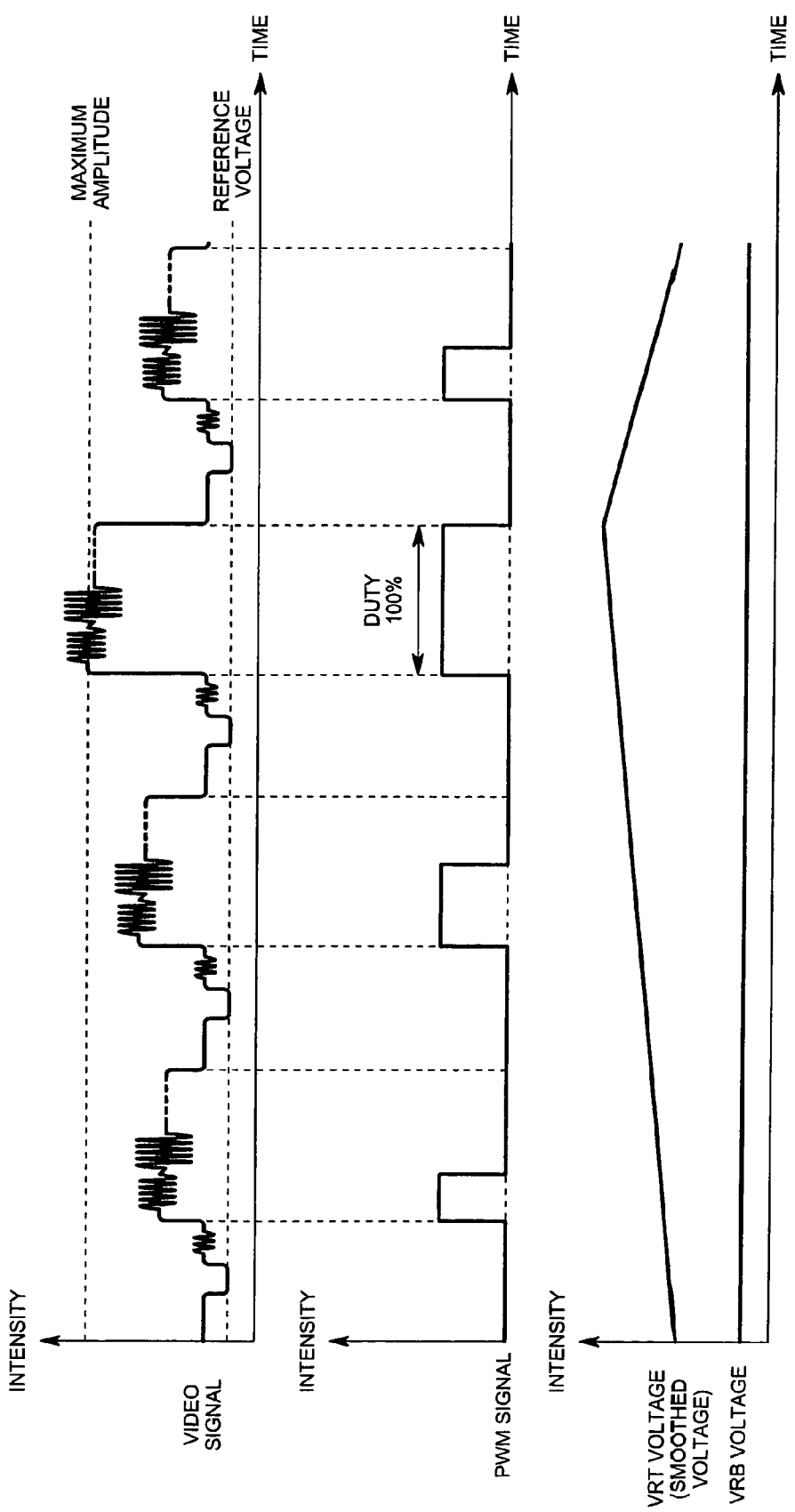
FIG. 2 is a timing chart for describing function of the video signal processing device in the first embodiment.
Figure 3:
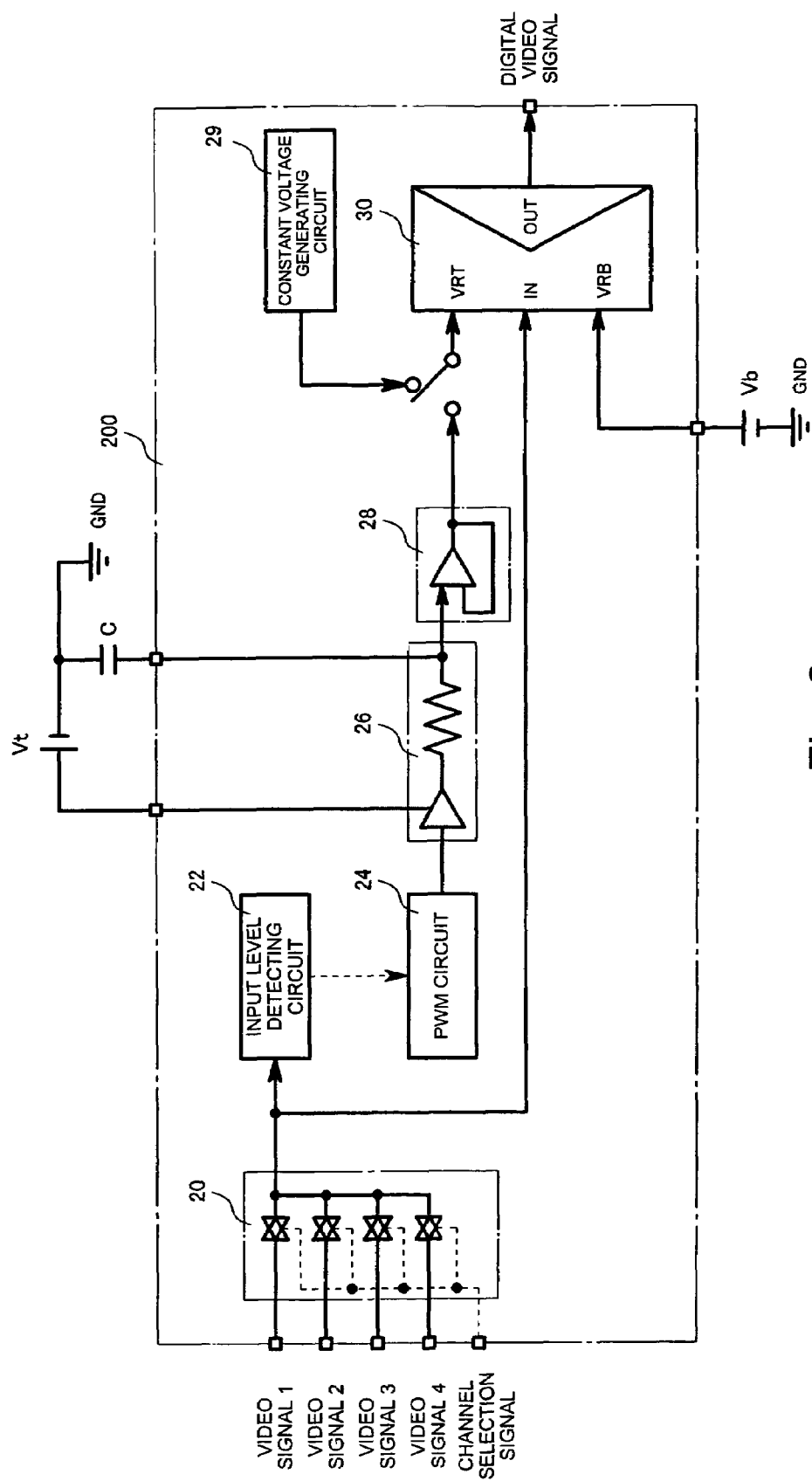
FIG. 3 is a block diagram showing a configuration of a video signal processing device according to a second embodiment.

Referring to FIG. 2, a composite video signal is obtained by superposing a direct current component, elevated or lowered in accordance with the luminance of an image, and a high frequency indicating a color component. The maximum amplitude (maximum value) in one frame of the composite video signal is detected by the comparator circuit in the input level detecting circuit 22, and the detected amplitude is converted to a digital signal by a digital/analog converter. Particularly, it is preferable to convert the maximum luminance value in one frame, i.e. the maximum amplitude of the direct current component, into a digital signal. The converted digital signal serves as the PWM control signal. The PWM control signal thus produced is provided to the PWM circuit 24.

The PWM circuit 24 receives the PWM control signal from the input level detecting circuit 22, and produces a PWM signal having a pulse width in accordance with the amplitude of the video signal selected by the channel switching circuit 20. The PWM circuit 24 is preferably formed by a pulse width modulating circuit operating at, for example, a clock rate of 13.5 MHz. The circuit is set to output the PWM signal having the pulse width in proportion to the amplitude of the video signal, as illustrated in FIG. 2. For example, when the maximum possible amplitude of the video signal is detected by the input level detecting circuit 22, the circuit is set to output the PWM signal having a pulse width of 100% duty cycle. When the detected amplitude is equal to 50% of the maximum possible amplitude of the video signal, the circuit is set to output the PWM signal having a pulse width of 50% duty cycle.

Generally, the PWM circuit 24 is also advantageous in that it generally requires fewer circuit elements than circuits such as programmable amplifiers and digital/analog converters, and that it can therefore be integrated into a smaller semiconductor chip without increasing the chip size.

The interface circuit 26 includes a buffer and a resistor element. The buffer receives the PWM signal from the PWM circuit 24. The voltage Vt is applied to a power supply terminal of the buffer from a source external to the device, and the PWM signal is modulated to have the amplitude of the voltage Vt, and supplied to one end of the resistor element. The other end of the resistor element is connected to the capacitor C provided outside the device, and connected to the ground through the capacitor C. Thus, an L-type low pass filter is formed by the resistor element and the capacitor C. Consequently, the PWM signal output from the buffer is smoothed in terms of time based on a time constant τ determined by the capacitance of the capacitor C and the resistance of the resistor element. Because the pulse width of the PWM signal is modulated based on the amplitude of the video signal selected by the channel switching circuit 20, the signal smoothed by the interface circuit 26 attains a voltage value in accordance with the amplitude of the video signal selected by the channel switching circuit 20, as illustrated in FIG. 2. The smoothed signal is transmitted to the maximum reference voltage terminal VRT of the A/D converter 30 through the control amplifier 28.

The interface circuit 26 according to the present embodiment includes the resistor element having at one end an external terminal for connecting a capacitor to the outside of the device. As a result, a low pass filter can be formed connecting the capacitor C to the outside of the device, so that the time constant τ of the low pass filter can easily be changed. It is also preferable to use the capacitor C having a variable capacitance so as to easily change the time constant τ of the low pass filter.

An input terminal IN of the A/D converter 30 receives the video signal selected by the channel switching circuit 20. The minimum reference voltage terminal VRB receives a constant voltage Vb from outside the device as a VRB voltage. The maximum reference voltage terminal VRT receives an output signal from the interface circuit 26 through the control amplifier 28 as a VRT voltage.

The A/D converter 30 converts the video signal applied to the input terminal IN into a digital signal with the dynamic range in accordance with the difference between voltages applied to the minimum reference voltage terminal VRB and the maximum reference voltage terminal VRT, and outputs the converted signal. For example, when the VRB voltage is 0 V and the VRT voltage is 1 V, the potential difference is 1 V, and the dynamic range is 1 V. When the VRB voltage and the VRT voltage are 0 V and 2 V, respectively, the potential difference is 2 V, and the dynamic range is 2 V.

The VRT voltage applied to the maximum reference voltage terminal VRT is high when the amplitude of the video signal selected by the channel switching circuit 20 is high, and is low when the amplitude of the video signal is low. As a result, the video signal can be converted to a digital signal with the dynamic range in accordance with the maximum amplitude of the direct current component in one frame of the video signal.

It is also preferable to provide a constant voltage generating circuit 29 in the video signal processing device 200 so as to switch from the output of the control amplifier 28. This configuration makes it possible to fix the dynamic range of the digital signal provided from the A/D converter 30 regardless of the amplitude of the video signal.

As described above, a video signal can be digitized by changing the reference voltage of the analog/digital converter in accordance with the amplitude of the direct current component of the video signal while maintaining an appropriate dynamic range of the video signal without complicating or increasing the size of the circuit.

Figure 4:
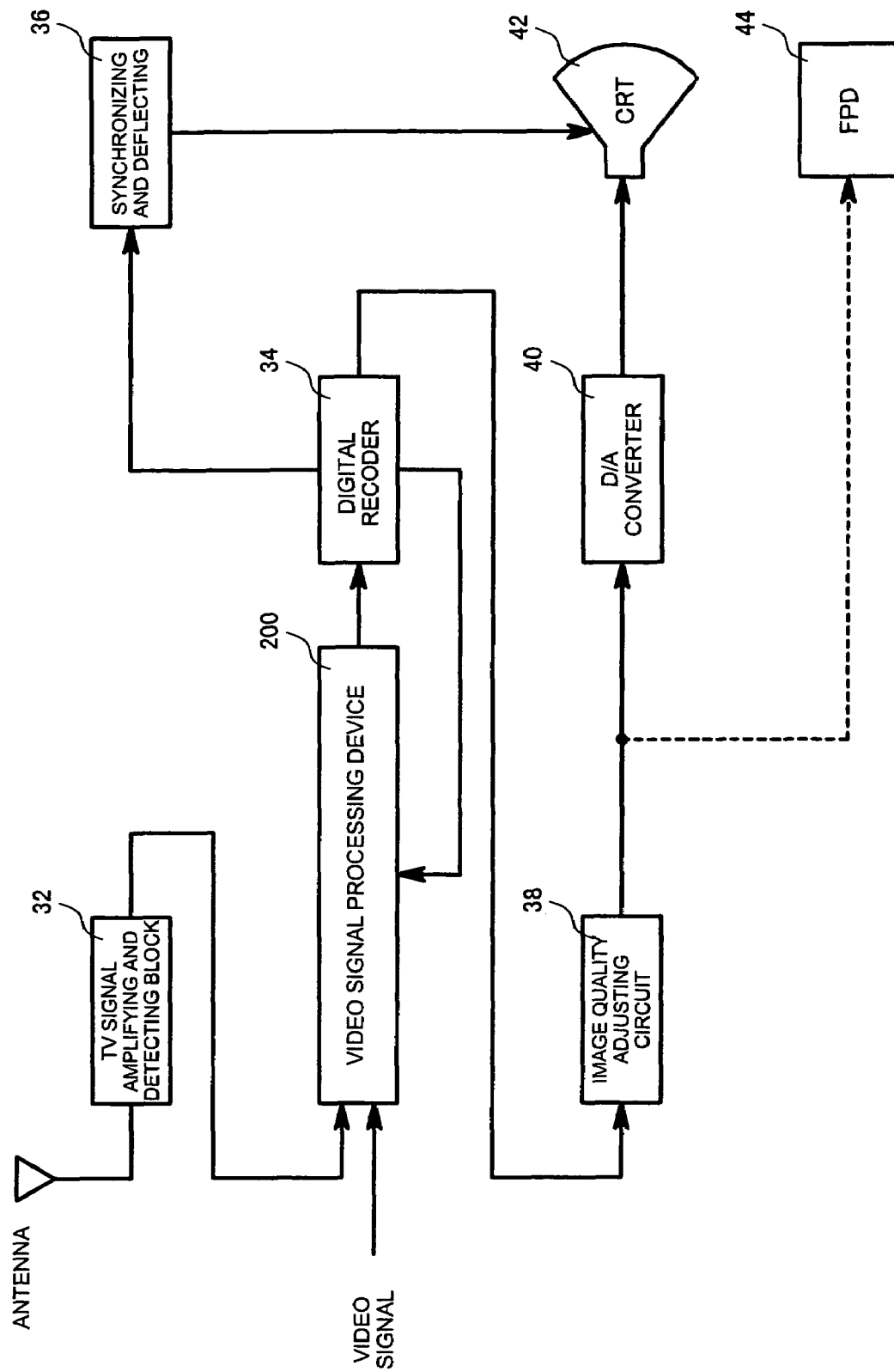
FIG. 4 is a block diagram showing a configuration of a television receiving device using the video signal processing device according to an embodiment of the present invention.
Figure 5:
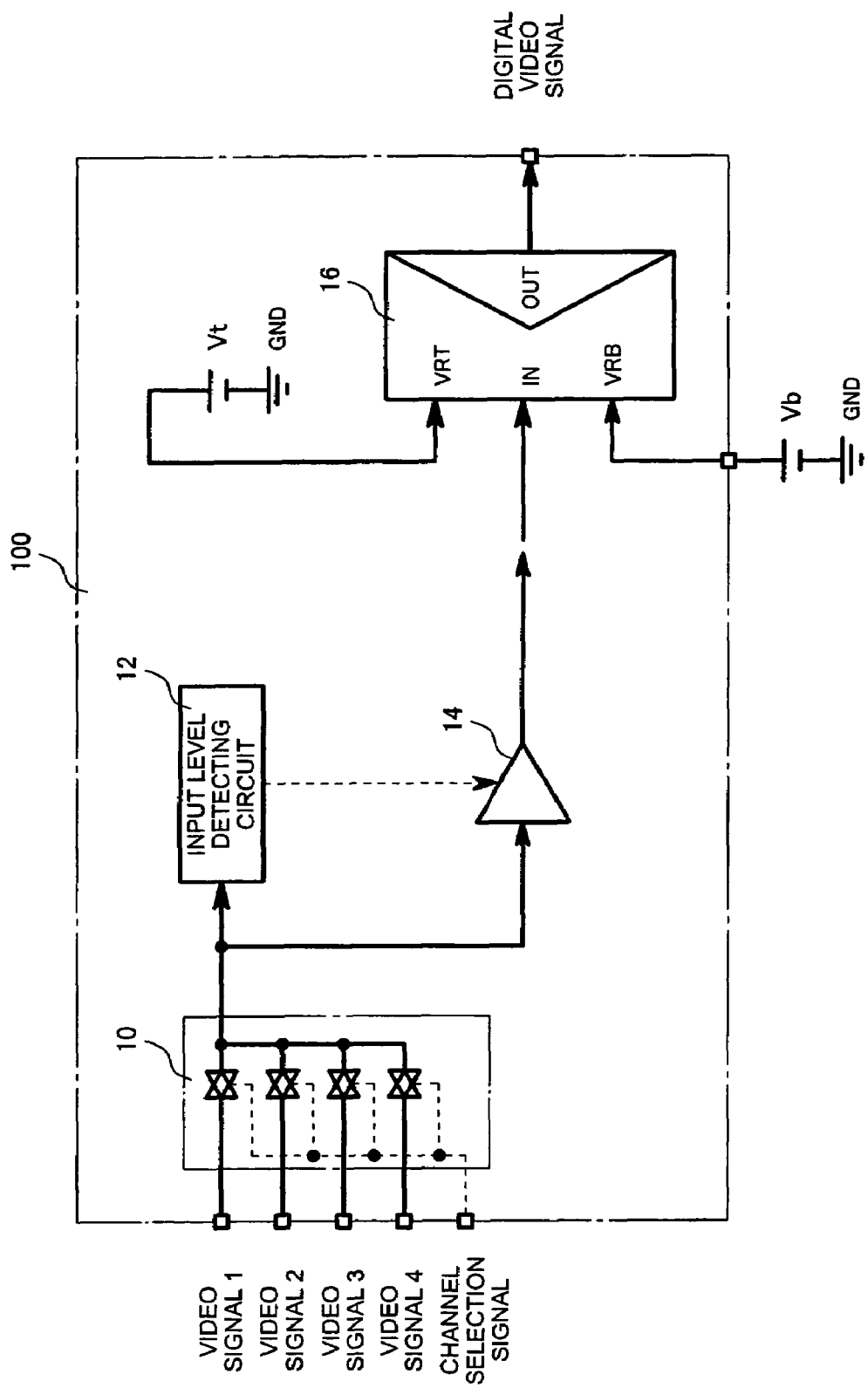
FIG. 5 is a block diagram showing a configuration of a video signal processing device in a related art.
Figure 6:
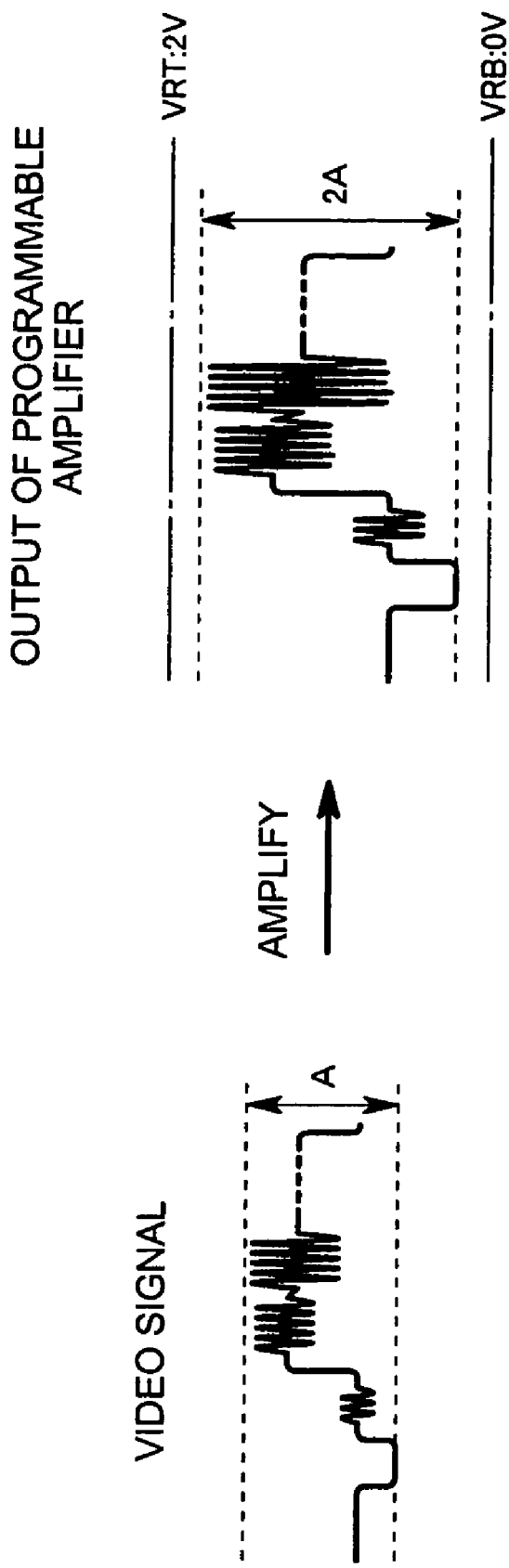
FIG. 6 is a block diagram for describing function of the video signal processing device in the related art.

Referring to FIG. 4, the video signal processing device 200 according to the present embodiment can be used in a television receiver. The television receiver includes an antenna, a TV signal amplifying and detecting block 32, a digital decoder 34, a synchronizing and deflecting circuit 36, an image quality adjusting circuit 38, a digital/analog (D/A) converter 40, a CRT 42, and the video signal processing device 200.

The video signal received by the antenna is detected and amplified by the TV signal amplifying and detecting block 32, and transmitted to the video signal processing device 200. In the device 200, the video signal is converted to a digital signal having a dynamic range in accordance with the amplitude thereof. The digital decoder 34 receives the digital signal, and produces a control signal for the synchronizing and deflecting circuit 36 used to display an image on the CRT 42, an image quality adjustment signal for adjusting the quality of the image, and a conversion adjustment signal for adjusting the output of the video signal processing device 200.

The image quality adjusting circuit 38 includes a circuit for adjusting the quality of the image, i.e. adjusting luminance, contrast, and the like of the displayed video image, on the CRT 42. The image quality adjusting circuit receives the image quality adjustment signal from the digital decoder 34, and supplies a digital signal for controlling, among others, an output from an electron ray tube of the CRT 42. The signal is converted to an analog signal by the D/A converter 40, so that the quality of the video image displayed on the CRT 42 is adjusted. The synchronizing and deflecting circuit 36 receives the control signal from the digital decoder 34, and synchronizes and deflects a scanning line of the CRT 42. Through such a process, a video image is presented on the display of the CRT 42.

The CRT 42 may be replaced with a flat panel display (FPD) 44, such as a liquid crystal display and a plasma display. The FPD 44 can be directly controlled with the digital signal.

As described above, by providing a television receiving device with the video signal processing device 200 of the present embodiment, it is possible to maintain a sufficiently wide dynamic range of a video image. For example, even when luminance of the entire video image varies, the image can be displayed with the appropriate dynamic range in accordance with each luminance level.

What is claimed is:

1. A video signal processing device, comprising:
   an input level detecting circuit for detecting an amplitude of a video signal to be processed, and providing a control signal in accordance with the amplitude;
   a PWM circuit for receiving the control signal from said input level detecting circuit, modulating a pulse width in accordance with the amplitude of said video signal, and providing a PWM signal; and
   an analog/digital converter for performing analog/digital conversion of said video signal using as a reference voltage a voltage obtained by smoothing said PWM signal in terms of time.

2. The video signal processing device according to claim 1, further comprising:
   a resistor element forming a low pass filter for smoothing said PWM signal, and having an end connected to an external terminal for connecting to a capacitor outside the device.

3. The video signal processing device according to claim 1, further comprising:
   a constant voltage generating circuit, and
   a switching circuit for switching between a voltage output from said constant voltage generating circuit and a voltage obtained by smoothing said PWM signal in terms of time, and providing an output as the reference voltage of said analog/digital converter.

4. The video signal processing device according to claim 2, further comprising:
   a constant voltage generating circuit, and a switching circuit for switching between a voltage output from said constant voltage generating circuit and a voltage obtained by smoothing said PWM signal in terms of time, and providing an output as the reference voltage of said analog/digital converter.

5. A television receiving device, comprising:
   video signal receiving circuit for receiving a video signal;
   an input level detecting circuit for detecting an amplitude of the video signal received by said video signal receiving circuit, and providing a control signal in accordance with the amplitude;
   a PWM circuit for receiving the control signal from said input level detecting circuit, modulating a pulse width in accordance with the amplitude of the video signal received by said video signal receiving circuit, and providing a PWM signal; and
   an analog/digital converter for performing analog/digital conversion of said video signal received by said video signal receiving circuit using as a reference voltage a voltage obtained by smoothing said PWM signal in terms of time, wherein a video image is displayed based on the video signal digitized by said analog/digital converter.

* * * * *